United States Patent [19]

Mihara

[11] Patent Number: 4,931,846
[45] Date of Patent: Jun. 5, 1990

[54] VERTICAL MOSFET HAVING VOLTAGE REGULATOR DIODE AT SHALLOWER SUBSURFACE POSITION

[75] Inventor: Teruyoshi Mihara, Yokosuka, Japan

[73] Assignee: Nissan Motor Company, Limited, Yokohama, Japan

[21] Appl. No.: 185,387

[22] Filed: Apr. 25, 1988

[30] Foreign Application Priority Data

May 29, 1987 [JP] Japan ................. 62-133960

[51] Int. Cl.[5] ........................... H01L 27/00
[52] U.S. Cl. .................. 357/23.4; 357/23.9; 357/23.13; 357/13; 357/48
[58] Field of Search .......... 357/23.4, 13, 48, 23.13, 357/23.9

[56] References Cited

U.S. PATENT DOCUMENTS 4,686,551 8/1987 Mihara ..................... 357/23.4

FOREIGN PATENT DOCUMENTS 0011331 6/1984 European Pat. Off. .
59-98557 6/1984 Japan .
59-214263 12/1984 Japan .................. 357/23.4
60-19695 10/1985 Japan .

OTHER PUBLICATIONS

RCA Technical Note No. 1343, Dated Mar. 14, 1984, Avalanche Diode Structure.

Primary Examiner—Andrew J. James
Assistant Examiner—David Soltz
Attorney, Agent, or Firm—Foley & Lardner, Schwartz, Jeffery, Schwaab, Mack, Blumenthal & Evans

[57] ABSTRACT

A vertical MOSFET device has a first conductivity type substrate layer serving as a drain, a second conductivity type channel region extending into said substrate layer from a top surface, and a first conductivity type source region extending into the channel region from the top surface. The channel region has a peripheral subregion extending deeply into the substrate layer from the top surface under an insulated gate electrode, and a shallow central subregion shallower than the peripheral subregion. There is further provided a second conductivity type underlying layer formed under the shallow central subregion so as to form a voltage regulating diode with the channel region at a position shallower than the bottom of the peripheral subregion.

1 Claim, 6 Drawing Sheets

VERTICAL MOSFET HAVING VOLTAGE REGULATOR DIODE AT SHALLOWER SUBSURFACE POSITION

REFERENCES TO RELATED APPLICATIONS

U.S. applications Ser. Nos. 063,116 (filed June 17, 1987) and 060,224 (filed June 10, 1987) relate to vertical MOSFETs having zener or Schottky diodes. U.S. applications Ser. Nos. 022,967 (filed Mar. 6, 1987, and 119,453 (filed Nov. 10, 1987 relate to conductivity modulated type MOSFETs.

BACKGROUND OF THE INVENTION

The present invention relates to a vertical MOSFET used as a switching device or the like.

Figure 7:
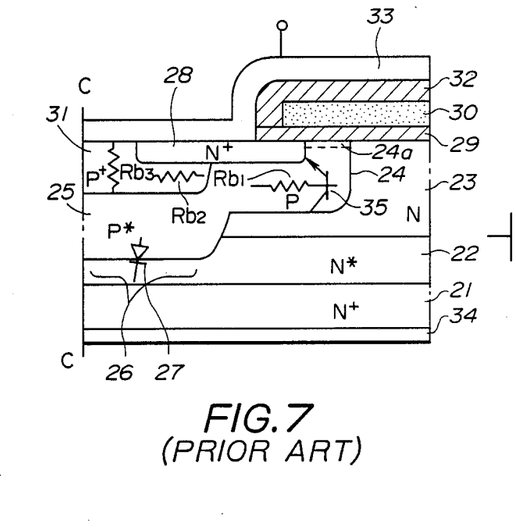
FIG. 7 is a vertical section showing a conventional vertical MOSFET structure.
Figure 8:
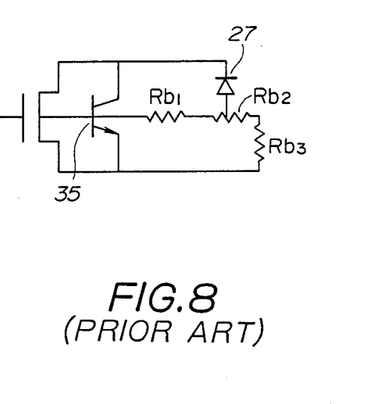
FIG. 8 is a diagram showing an equivalent circuit of the conventional vertical MOSFET structure of FIG. 7, including a parasitic bipolar transistor.

FIGS. 7 and 8 show a conventional power MOSFET (Japanese patent provisional publication No. 59-98557). The vertical MOSFET device shown in FIG. 7 is formed on and in a semiconductor substrate having a highly doped N+ bottom layer 21, a lightly doped N top layer 23 which functions substantially as a drain, and an intermediate N* layer 22 formed between the bottom and top layers 21 and 23. A plurality of P-type channel regions 24 are formed in the N top substrate layer 23. FIG. 7 shows only one of the regions 24. A P* well region 25 is formed in a central portion of each channel region 24. Each of the P* well regions 25 is made deeper than the P channel regions 24. Each well region 25 extends deeply from the top surface of the substrate into the N top layer 23, and reaches the N* intermediate layer 22, so that a PN junction 26 is formed between the bottom of the P* well region 25 and the N* intermediate layer 22. This PN junction 26 functions as a clamping diode 27 for preventing the potential of the drain from exceeding a predetermined value.

An N+ source region 28 is formed in each P channel region 24. Above the P channel region 24 between the N+ source region 28 and the N top layer 23, there is formed an insulated gate electrode 30 for inducing a channel 24a in the P channel region along the top surface of the substrate. The gate electrode 30 is insulated by a gate insulating film 29.

In FIG. 7, there are further shown a P+ base region 31, a PSG insulating interlayer 32, a topside source electrode 33, and a drain electrode 34 formed on the bottom of the N+ bottom layer 21. The source electrode 33 is connected with the source region 28, and further connected with the P channel region 24 and the P* well region 25 through the P+ base region 31.

When a positive voltage of a predetermined magnitude is applied to the drain electrode 34 and a gate voltage above a threshold voltage is applied to the gate electrode 30, then the channel 24a becomes conductive, and allows a current to flow from the drain electrode 34 to the source electrode 33. In the vertical MOSFET having such a structure, there is formed a parasitic NPN bipolar transistor 35 which has an emitter formed by the N+ source region 28, a base formed by the P channel region 24, and a collector formed by the N top substrate layer 23. In the P channel region 24 and the P+ base region 31, there are formed base resistances $Rb_1$, $Rb_2$ and $Rb_3$ of the transistor 35. In this structure shown in FIG. 7, the base resistances $Rb_2$ and $Rb_3$ are lowered by formation of the highly doped P+ base region 31. However, the structure of FIG. 7 does not have any means for lowering the resistance $Rb_1$.

Therefore, the resistance $Rb_1$ increases the possibility of second breakdown. When, for example, the vertical MOSFET is used as a switching device for an inductive load, a high surge voltage applied between the drain and source during turn-off tends to cause a breakdown of the junction between the P channel region 24 and the N substrate layer 23. The resulting breakdown current can easily turn on the bipolar transistor 35 by flowing through the resistance $Rb_1$, with the result of second breakdown and thermal destruction of the device.

The vertical MOSFET device of FIG. 7 is designed to decrease such an undesired tendency toward permanent destruction of the device by forming the clamping diode 27 between the P* well region 25 and the N* intermediate layer 22. This clamping diode 27 is turned on by application of a high surge voltage between the drain and source, and functions to prevent the potential of the N substrate layer 23 from exceeding a predetermined value. In this way, the clamping diode 27 decreases the tendency to second breakdown and thermal destruction by preventing breakdown of the junction between the N layer 23 and the P channel region 24.

In this conventional device, however, the P* well region 25 is made deeper than the P channel region 24 so that the N* intermediate substrate layer 22 is reached by the P* well region 25, and the clamping diode 27 is formed by the PN junction 26 between the P* well region 25 and the N* intermediate layer 22.

Especially when this vertical MOSFET is used as a power switching device, it is desirable to make the clamping voltage of the clamping diode 27, that is, the upper limit of the drain voltage, as high as possible within the range in which a breakdown at the P channel region 24 can be prevented.

In order to increase the clamping voltage of the clamping diode 27, it is necessary to decrease the impurity concentrations of the P* well region 25 and the N* intermediate layer 22, and to make the P* well region 25 sufficiently deep to ensure a depletion layer whose width is increased by decrease of the doping levels of the P* well region 25 and the N* layer 22.

However, the diffusion step to deepen the P channel region 25 entails increase in the lateral diffusion, which results in a larger cell size and a higher on resistance.

SUMMARY OF THE INVENTION

It is therefore an object of the present invention to provide a vertical MOSFET device having a structure which can improve the capability of withstanding surges without secondary breakdown by preventing turn-on of the parasitic bipolar transistor, and at the same time which can reduce the cell size.

According to the present invention, a vertical MOSFET device comprises a first substrate layer of a first conductivity type serving as a drain, an insulated gate electrode, a source region of the first conductivity type, a channel region of a second conductivity type, and a highly doped underlying of the first conductivity type.

The first substrate layer is formed in a semiconductor substrate so that a first major surface of the substrate is included in the first substrate layer. The insulated gate electrode is formed above the first surface of the substrate, and insulated from the substrate by a gate insulating layer. The source region of the first conductivity type is formed in the substrate so that the source region extends into the substrate from the first major surface.

The channel region of the second conductivity type opposite to the first conductivity type is formed in the first substrate layer so as to surround the source region and separate the source region from the first substrate layer. The channel region comprises a deep subregion and a shallow subregion. The deep subregion is formed directly below the gate electrode so that a conducting channel can be induced in an uppermost portion of the deep subregion between the source region and the first substrate layer, immediately below the gate electrode. The shallow subregion is shallower from the first major surface than the deep subregion.

The highly doped underlying layer is formed under the shallow subregion of the channel region so as to form a diode between the underlying layer and the channel region for preventing a potential of the first substrate layer from exceeding a predetermined value. The diode is formed at a position shallower from the first major surface of the substrate than the bottom of the deep subregion.

DETAILED DESCRIPTION OF THE INVENTION

Figure 1:
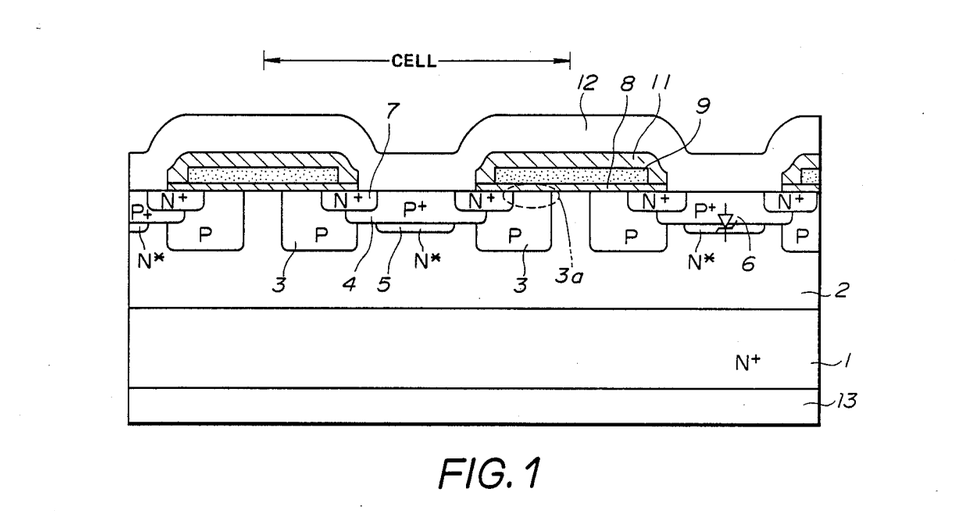
FIG. 1 is a vertical section of a vertical MOSFET device according to a first embodiment of the present invention.
Figure 2:
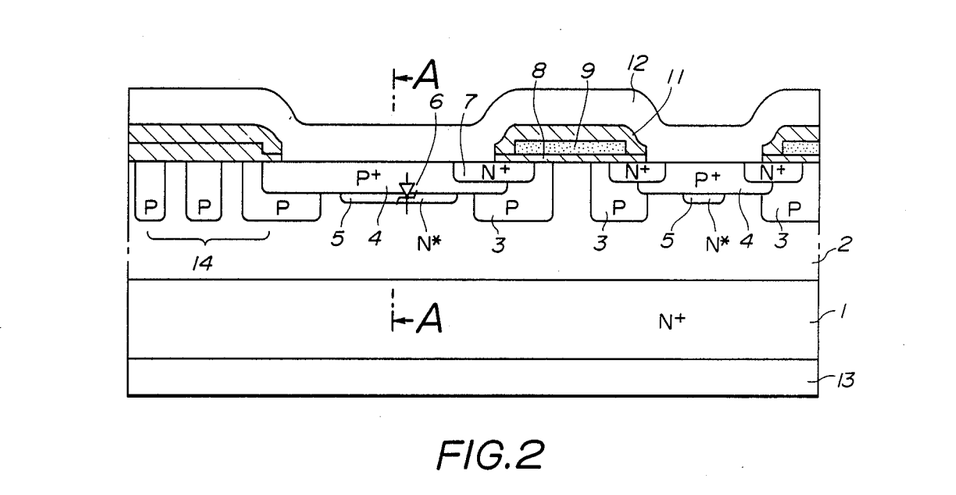
FIG. 2 is a vertical section showing a peripheral portion of the vertical MOSFET device of FIG. 1.

A first embodiment of the present invention is shown in FIGS. 1 and 2.

A vertical MOSFET device shown in FIG. 1 is formed on and within a semiconductor substrate or wafer having a topside major surface and a bottom major surface. The substrate includes a highly doped N+-type lower layer 1 including the bottom surface of the substrate, and a lightly doped N-type upper layer 2 which is formed on the N+ lower layer 1, and extends from the N+ lower layer 1 to the top surface of the substrate. The N upper layer 2 serves substantially as a drain of the vertical MOSFET device.

One or more P-type channel regions are formed in the N upper substrate layer 2. Each channel region extends into the N upper substrate layer 2 from the top substrate surface. Each channel region includes a P-type peripheral subregion 3 and a highly doped P+-type central base subregion 4. Both of the subregions 3 and 4 extends into the N upper substrate layer 2 from the top surface. However, the highly doped P+ central base subregion 4 is shallower than the P peripheral subregion 3.

A highly doped N*-type underlying diffusion layer 5 is formed under the bottom of the P+ central subregion 4 of each channel region so as to form a PN junction 6 which serves as a clamping diode for preventing the potential of the drain from increasing above a predetermined value.

The PN junction 6 can be formed by first forming the N* region 5 by diffusion from the top surface of the substrate, and then diffusing the P-type impurity from the top surface to form the P+ base subregion 4. A clamping voltage of the diode 6, that is an upper limit of the drain potential, is determined by controlling the impurity concentration of the N* diffusion region 5.

In this embodiment, the impurity concentration of the underlying layer 5 is higher than that of the upper substrate layer 2. Furthermore, the underlying layer 5 of this embodiment is shallower than the peripheral subregion 3, as shown in FIGS. 1 and 2.

At least one N+ source region 7 is formed in each channel region 3, 4, and extends into the channel region from the top substrate surface. A gate electrode 9 is formed just above the P peripheral subregion 3 of each channel region, and separated from the substrate by a gate insulating layer 8. The gate electrode 9 is used for inducing a channel $3a$ in a surface layer of the peripheral subregion 3 immediately below the gate electrode 9. The vertical MOSFET of this embodiment is an N-channel type.

The device of FIG. 1 further includes an insulating interlayer 11 of PSG, a source electrode 12 and a drain electrode 13. The source electrode 12 is connected with the N+ source region 7 and the P+ central base subregion 4 of each channel region. The peripheral subregion 3 is connected with the source electrode 12 through the P+ base subregion 4. The drain electrode 13 is formed on the bottom surface of the substrate.

In this embodiment, a cell is formed by each channel region, and at least one source region 7 formed in that channel region. The device of FIG. 1 has a plurality of such cells. The cells are arranged regularly in an active area, which is surrounded by a peripheral area shown in FIG. 2. As shown in FIG. 2, a guard ring structure 14 is formed to attain a high withstand voltage. The guard ring structure 14 is formed to attain a high withstand voltage. The guard ring structure 14 of this embodiment has a plurality of P-type regions extending into the N upper substrate layer 2 from the top surface. At the inner periphery of the guard ring structure 14, there is formed at least one clamping diode 6 similar to the clamping diodes 6 formed in the active area. The clamping diode 6 of the peripheral area is also formed by a PN junction between the P+ base region 4 and the N* underlying layer 5, as shown in FIG. 2.

A process for fabricating the vertical MOSFET device of the first embodiment is shown in FIGS. 9A-9H.

Figure 9A:
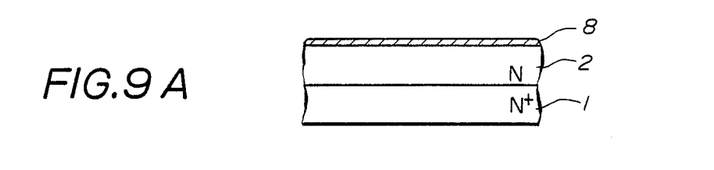
FIGS. 9A-9H are vertical sections for showing a process for fabricating the vertical MOSFET device of FIG. 1.

At a step of FIG. 9A, the N-type upper substrate layer 2 is formed on the N+ lower substrate layer 1 by epitaxial growth or other technique. Then, the gate insulating film 8 is formed on the N upper layer 2.

At a step of FIG. 9A, the N-type upper substrate layer 2 is formed on the N+ lower substrate layer 1 by epitaxial growth or other technique. Then, the gate insulating film 8 is formed on the N upper layer 2.

Figure 9B:
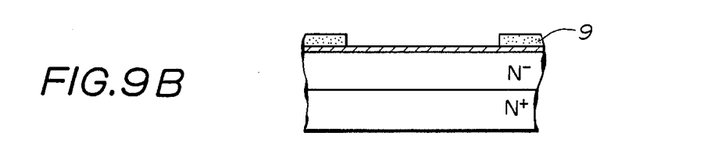

At a step of FIG. 9B, the gate electrodes 9 of polycrystalline silicon are formed on the gate insulating film 8.

Figure 9C:
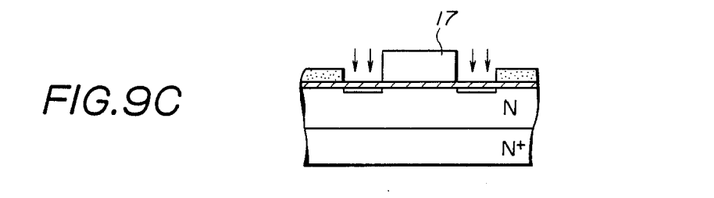

At a step of FIG. 9C, a resist 17 is provided between the electrodes 9, and B+ (boron) ions are implanted to form the P channel region 3.

Figure 9D:
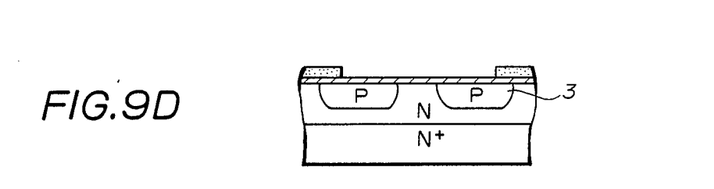

At a step of FIG. 9D, the channel region 3 is formed by diffusing the implanted B+ ions into the N layer 2.

Figure 9E:
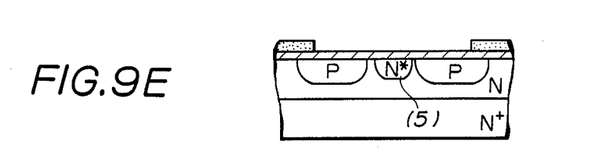

At a step of FIG. 9E, P+ (phosphorus) ions are implanted and diffused to formed the N* diffusion region 5 in the area surrounded by the channel region 3 formed in the preceding step. In this state, the N* region 5 extends into the N layer 2 from the top surface of the substrate.

Figure 9F:
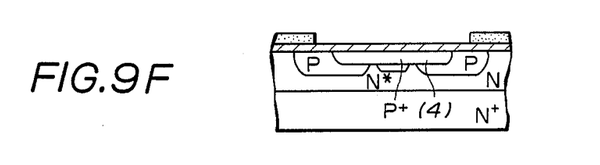

At a step of FIG. 9F, the P+ base region 4 is formed by implantation and diffusion of B+ ions.

Figure 9G:
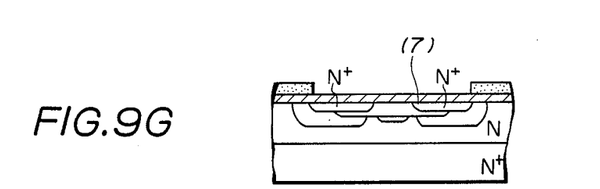

At a step of FIG. 9G, the N+ source region 7 is formed by implantation and diffusion of P+ ions.

Figure 9H:
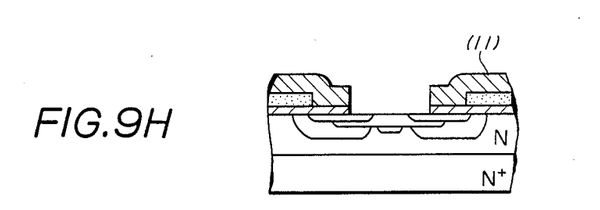

At a step of FIG. 9H, a PSG layer is deposited over the entire surface of the substrate, and contact
holes are opened by photoetching.

Finally, the source and drain electrodes 12 and are formed.

The vertical MOSFET device of the first embodiment is operated as follows:

In each cell, the clamping diode 6 is formed by the PN junction between the shallow P+ base subregion 4 and the N* underlying region 5, at such a shallow position that the distance between the clamping diode 6 and the top major surface of the substrate is smaller than the depth of the P peripheral subregion 3 from the top substrate major surface.

Therefore, the clamping diode 6 can be formed by diffusion with less lateral diffusion effects. By restricting the lateral diffusion effects, the structure of this embodiment makes it possible to reduce the size of the cells and the on resistance.

During normal operation, the vertical MOSFET device of this embodiment functions as a switching device having a high current handling capability. The channel 3a is made conductive, and a current flows from the drain electrode 13 to the source electrode 12 when a positive voltage of a predetermined magnitude is applied to the drain electrode, and a gate voltage above the threshold voltage is applied to the gate electrode 9.

When a high surge voltage is applied between the drain and source of this vertical MOSFET device used as a switching device for an inductive load, the clamping diode 6 is turned on, and prevents breakdown from occurring at the junction between the N layer 2 and the P region 3 by suppressing an increase of the potential of the N drain layer 2 under a predetermined limit. Therefore, the structure of this embodiment can prevent turn-on of the parasitic transistors formed in the vertical MOSFET as shown in FIG. 8, and reduce the possibility of secondary breakdown.

It is possible to make all the cells of a multi-cell chip approximately uniform in the clamping voltage of the clamping diode 6, by controlling the impurity concentrations of the N* underlying layer 5 and the P+ base region 4. Such a structure having uniform cells can distribute the surge current flowing through the clamping diodes due to a high surge voltage, uniformly over the entirety of the chip, and by so doing prevent localized temperature increase due to localized current concentration.

Figure 3:
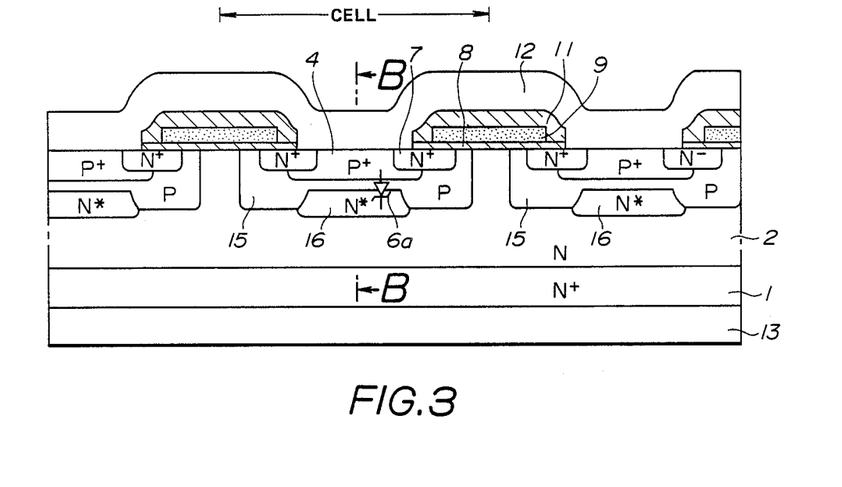
FIG. 3 is a vertical section of a vertical MOSFET device according to a second embodiment of the present invention.
Figure 4:
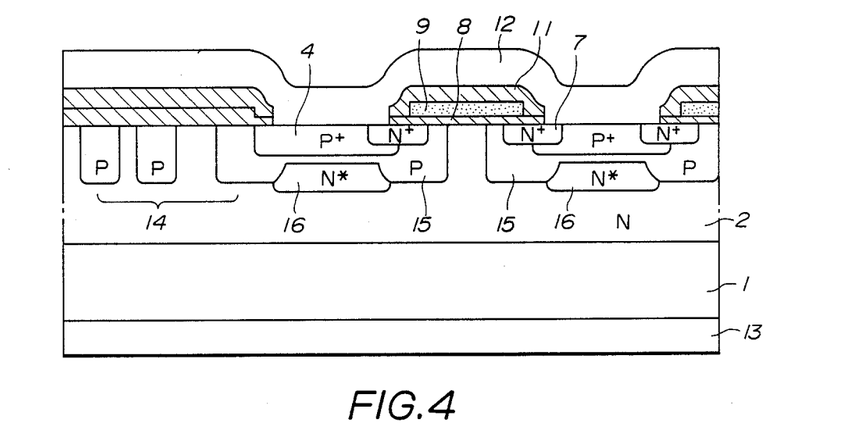
FIG. 4 is a vertical section showing a peripheral portion of the vertical MOSFET device of FIG. 3.

A second embodiment of the present invention is shown in FIGS. 3 and 4. In the second embodiment, a clamping diode 6a is formed by a junction between an N* diffusion layer 16 which is formed beforehand by diffusion in a central portion of each cell, and a P-type channel region 15 which is formed by a next diffusion step.

FIG. 4 shows the peripheral area of the device of FIG. 3.

In order to increase the withstand voltage, the device of the second embodiment is also provided with a guard ring structure 14 similar to the structure 14 of FIG. 2.

Figure 5A:
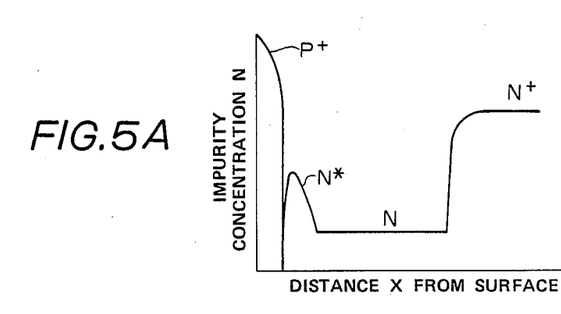
FIG. 5A is a graph showing an impurity concentration profile of the device of the first embodiment, taken along a line A—A of FIG. 2.
Figure 5B:
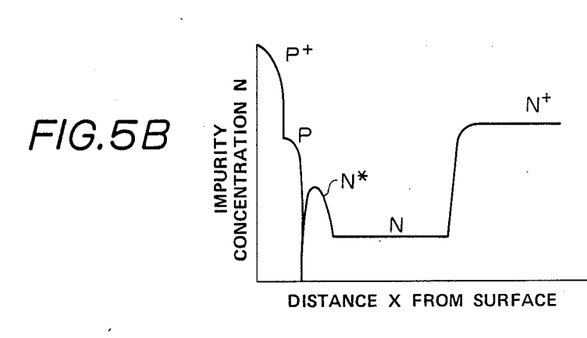
FIG. 5B is a graph showing an impurity concentration profile of the device of the second embodiment, taken along a line B—B of FIG. 3.
Figure 5C:
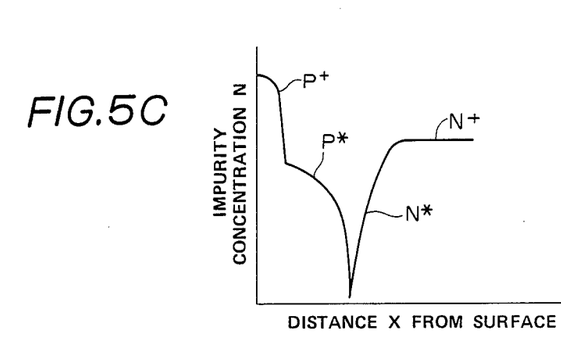
FIG. 5C is a graph showing an impurity concentration profile of a conventional device shown in FIG. 7, taken along a line C—C of FIG. 7.

FIG. 5B shows an impurity concentration profile taken along a line B—B of FIG. 3. For the purpose of comparison, FIG. 5A shows an impurity concentration profile of the first embodiment device, taken along a line A—A of FIG. 2, and FIG. 5C shows an impurity concentration profile of the conventional device along a line C—C of FIG. 7. As seen from these profiles, the clamping diode 6a of the second embodiment is formed at a slightly deeper position from the major surface of the N substrate layer 2 than the clamping diode 6 of the first embodiment. However, the structure of the second embodiment is advantageous in that the gate threshold voltage can be made more uniform in the following manner.

Figure 6A:
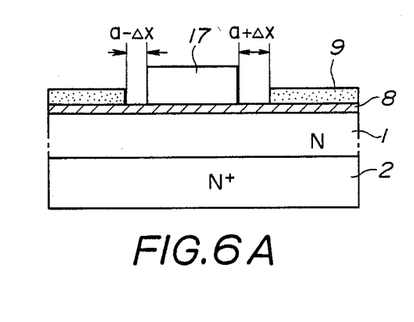
FIGS. 6A and 6B are vertical sections for showing fabricating steps of the first and second embodiments, respectively.
Figure 6B:
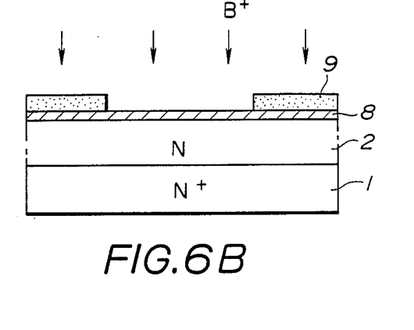

FIG. 6A shows a fabrication step for forming the P channel subregion 3 of the first embodiment, and FIG. 6B shows a step for forming the P channel subregion 15 of the second embodiment. In the first embodiment, the P channel subregion 3 is formed by the B+ ion implantation using the photoresist coating 17 on the area in which the clamp diode 6 is to be formed. However, the mask alignment for forming the photoresist 17 tends to entail misalignment as expressed by $a - \Delta \times$ and $a + \Delta \times$ in FIG. 6A, resulting in variation of the impurity concentration of the P channel subregion 3 and variation of the gate threshold voltage. The structure of the second embodiment eliminates the necessity of the resist 17 in a step corresponding to the step of FIG. 9C, so that the gate threshold voltage can be made more uniform.

The structure of the second embodiment, particularly when applied to a device for a high breakdown voltage, can reduce the on resistance and improve the capability of withstanding secondary breakdown almost in the same manner as in the first embodiment.

The present invention is applicable not only to vertical MOSFETs of the N channel type as in the first and second embodiments, but also to vertical MOSFETs of the P channel type.

What is claimed is:
1. A vertical MOSFET device, comprising:
a first substrate layer of a first conductivity type formed in a semiconductor substrate and including a first major surface of the substrate;
an insulated gate electrode formed above said first surface of said substrate;
a gate insulating layer insulating the gate electrode from the substrate;
a source region of said first conductivity type extending into the substrate from said first surface;
a channel region of second conductivity type formed in said first substrate layer so as to surround said source region and separate said source region from said first substrate layer, said channel region comprising a deep subregion formed under said insulat- ing gate electrode so that a conducting channel can be induced in said deep subregion immediately below said gate electrode, between said source region and said first substrate layer, and a shallow region surrounded by said deep subregion and shallower from said first surface than said deep subregion; and a highly doped underlying layer of said first conductivity type formed under said shallow subregion in contact with said shallow subregion so as to form a p-n junction between said underlying layer and said shallow subregion for preventing a potential of said first substrate layer from exceeding a predetermined value, said p-n junction being formed at a position shallower from said first surface than said deep subregion;

wherein, the impurity concentration of said shallow subregion is higher than that of said deep subregion and the impurity concentration of said underlying layer is higher than that of said first substrate layer.

* * * * *